US012801011B2

(12) United States Patent
Piumi et al.

(10) Patent No.: US 12,801,011 B2
(45) Date of Patent: Nov. 17, 2026

(54) STRUCTURES FOR PATTERNING AND RELATED METHODS AND SYSTEMS

(71) Applicant: ASM IP Holding B.V., Almere (NL)

(72) Inventors: Daniele Piumi, Etterbeek (BE); David Kurt de Roest, Leuven (BE); João Antunes Afonso, Tama (JP); Steaphan Mark Wallace, Leuven (BE); Yoann Tomczak, Leuven (BE); René Henricus Jozef Vervuurt, Leuven (BE)

(73) Assignee: ASM IP Holding B.V., Almere (NL)

( * ) Notice: Subject to any disclaimer, the term of this patent is extended or adjusted under 35 U.S.C. 154(b) by 90 days.

(21) Appl. No.: 18/740,139

(22) Filed: Jun. 11, 2024

(65) Prior Publication Data

US 2024/0419068 A1 Dec. 19, 2024

Related U.S. Application Data

(60) Provisional application No. 63/472,699, filed on Jun. 13, 2023.

(51) Int. Cl.

| | |
|---|---|
| ***G03F 7/20*** | (2006.01) |
| ***G03F 7/00*** | (2006.01) |
| ***G03F 7/11*** | (2006.01) |
| ***G03F 7/16*** | (2006.01) |
| *G03F 7/004* | (2006.01) |

(52) U.S. Cl.

CPC .............. *G03F 7/0035* (2013.01); *G03F 7/11* (2013.01); *G03F 7/161* (2013.01); *G03F 7/167* (2013.01); *G03F 7/70033* (2013.01); *G03F 7/0042* (2013.01)

(58) Field of Classification Search

CPC .......... G03F 7/0035; G03F 7/11; G03F 7/161; G03F 7/167; G03F 7/70033; G03F 7/0042; G03F 7/094; G03F 7/091; H01L 21/0332; H01L 21/0337

See application file for complete search history.

(56) References Cited

U.S. PATENT DOCUMENTS

| | | | |
|---|---|---|---|
| 2009/0197086 A1 | 8/2009 | Rathi | |
| 2021/0149298 A1* | 5/2021 | De Silva | G03F 7/0042 |
| 2022/0035247 A1* | 2/2022 | Tan | G03F 7/094 |
| 2022/0076996 A1 | 3/2022 | Blanquart | |
| 2022/0122841 A1 | 4/2022 | Blanquart | |
| 2022/0216059 A1 | 7/2022 | Liu | |
| 2022/0223411 A1 | 7/2022 | Blanquart | |
| 2022/0319834 A1 | 10/2022 | Vervuurt | |
| 2023/0059464 A1 | 2/2023 | Tomczak | |
| 2023/0071197 A1 | 3/2023 | Saha | |
| 2023/0077088 A1 | 3/2023 | Saha | |
| 2023/0091094 A1 | 3/2023 | Huotari | |
| 2023/0333476 A1 | 10/2023 | Tomczak | |
| 2025/0347996 A1* | 11/2025 | Ma | G03F 7/36 |

* cited by examiner

*Primary Examiner* — Mesfin T Asfaw

(74) *Attorney, Agent, or Firm* — Banner & Witcoff, Ltd.

(57) ABSTRACT

Structures and related systems and methods for dose reduction in extreme ultraviolet (EUV) lithography. The structures can comprise a dose reducing layer, an adhesion layer, and a resist.

12 Claims, 10 Drawing Sheets

STRUCTURES FOR PATTERNING AND RELATED METHODS AND SYSTEMS

CROSS-REFERENCE TO RELATED APPLICATION(S)

This Application claims the benefit of U.S. Provisional Application 63/472,699 filed on Jun. 13, 2023, the entire contents of which are incorporated herein by reference.

FIELD OF INVENTION

The present disclosure generally relates to structures, methods, and systems used in the formation of semiconductor devices. More particularly, the disclosure relates to the field of extreme ultraviolet lithography.

BACKGROUND OF THE DISCLOSURE

In Extreme Ultraviolet Lithography, extreme ultraviolet (EUV) radiation-absorbing elements can be used in resists or in underlying layers to limit the EUV dose needed for full exposure. This advantageously increases throughput. However, underlying layers in which extreme ultraviolet radiation (EUV) radiation-absorbing elements can be introduced can suffer from certain deficiencies. For example, they may not exhibit proper etch contrasts with certain resists, they may have poor adhesion with resist, and/or they may exhibit scumming.

Thus, there is a need for improved patterning stacks for Extreme Ultraviolet Lithography.

SUMMARY OF THE DISCLOSURE

Described herein is an embodiment of a structure comprising a dose reducing layer, the dose reducing layer comprising an extreme ultraviolet (EUV) radiation-absorbing element; a resist, the resist being sensitive to EUV; and, an adhesion layer, the adhesion layer being positioned between the dose reducing layer and the resist, the adhesion layer comprising amorphous carbon or an organic compound.

In some embodiments, the structure comprises a hard mask, wherein the dose reducing layer is positioned between the hard mask and the adhesion layer.

In some embodiments, the structure further comprises a patternable film, the hard mask being positioned between the patternable film and the dose reducing layer.

In some embodiments, the dose reducing layer has a thickness of at most 7.0 nm.

Further described herein is an embodiment of a method of forming a structure, comprising the following steps, in the given order: providing a substrate to a reaction chamber; forming a dose reducing layer on the substrate, the dose reducing layer comprising an EUV-absorbing element; forming an adhesion layer on the dose reducing layer, the adhesion layer comprising amorphous carbon or an organic compound; and, forming a resist on the adhesion layer.

In some embodiments, the structure is a structure as described herein.

In some embodiments, the substrate comprises a hard mask on which the dose reducing layer is formed.

In some embodiments, the dose reducing layer is formed by means of plasma-enhanced atomic layer deposition.

In some embodiments, the hard mask is formed by means of plasma-enhanced chemical vapor deposition.

In some embodiments, the resist is formed by means of molecular layer deposition.

Further described herein is an embodiment of a method of transferring a pattern into a substrate, the method comprising providing a substrate, the substrate comprising a structure, the structure comprising a dose reducing layer, the dose reducing layer comprising an extreme ultraviolet (EUV) radiation-absorbing element; a patterned resist, the patterned resist comprising a pattern; an adhesion layer, the adhesion layer being positioned between the dose reducing layer and the resist, the adhesion layer comprising amorphous carbon or an organic compound; and, a hard mask, wherein the dose reducing layer is positioned between the hard mask and the adhesion layer; exposing the substrate to a first etch, thereby transferring the pattern from the resist to the adhesion layer; exposing the substrate to a second etch, thereby transferring the pattern from the adhesion layer to the dose reducing layer; and, exposing the substrate to a third etch, thereby transferring the pattern from the dose reducing layer to the hard mask; wherein the first etch, the second etch, and the third etch are different.

In some embodiments, the resist comprises a metalorganic resist.

In some embodiments, the EUV radiation-absorbing element comprises tin.

Further described herein is an embodiment of a system comprising a dose reducing layer reaction chamber being constructed and arranged for forming a dose reducing layer; a resist reaction chamber being constructed and arranged for forming a resist; an adhesion layer reaction chamber, the adhesion layer reaction chamber being constructed and arranged for forming an adhesion layer; and, a transfer module constructed and arranged for moving a substrate between the dose reducing layer reaction chamber, the resist reaction chamber, and the adhesion layer reaction chamber while keeping the substrate in a vacuum or inert gas environment; wherein each of the dose reducing layer reaction chamber, the resist reaction chamber, and the adhesion layer reaction chamber are operationally coupled with one or more precursor sources; the system further comprising a controller, the controller being arranged for causing the system to carry out a method as described herein.

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

BRIEF DESCRIPTION OF THE DRAWING FIGURES

FIG. 1A describes an embodiment of a structure 100 that comprises a dose reducing layer 110, an adhesion layer 120, and a resist 130.

FIG. 1B describes an embodiment of a structure 100 that further comprises a hard mask 105

FIG. 1C shows an embodiment of a structure 100 that is formed on a substrate 101 that comprises a patternable film 102

Figure 4:
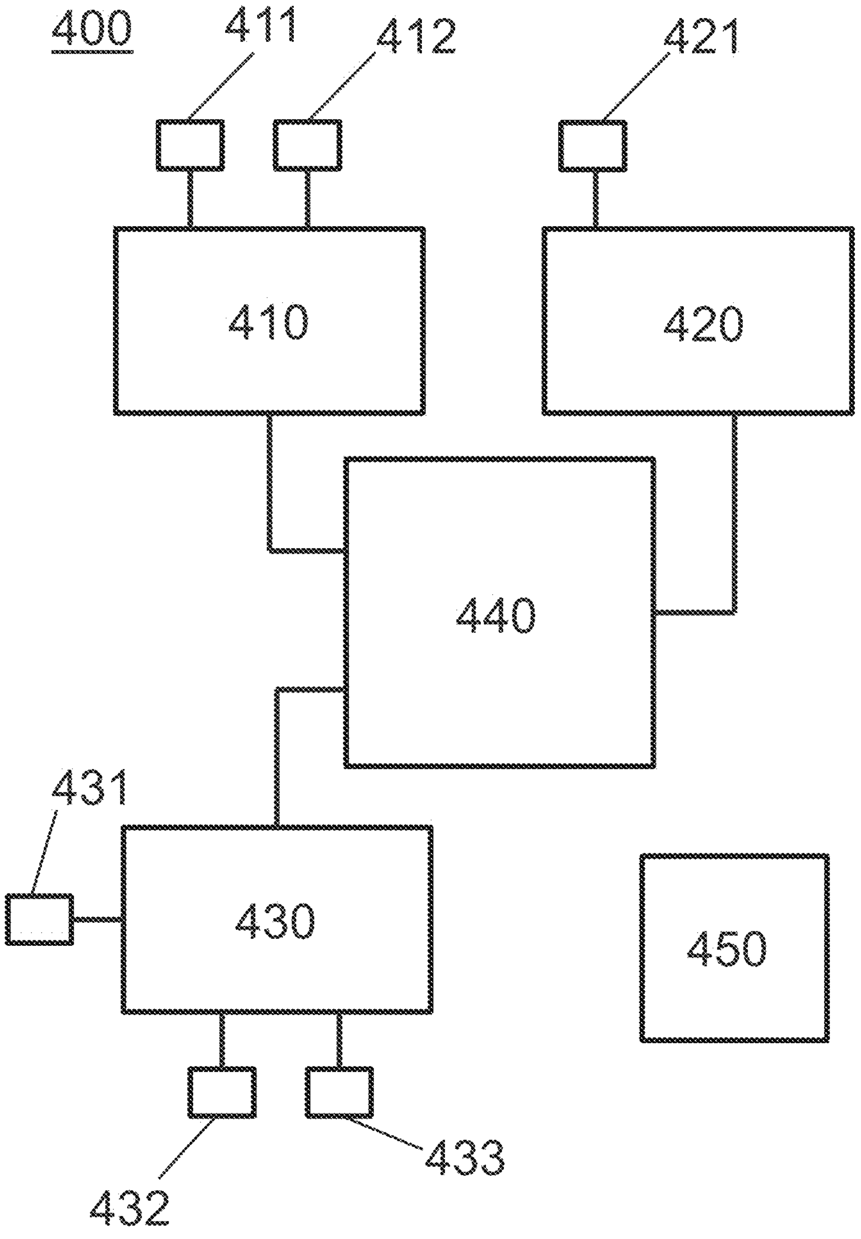

FIG. 4 shows an embodiment of a system 400 that comprises a dose reducing layer reaction chamber 410, a resist reaction chamber 420, an adhesion layer reaction chamber 430, and a transfer module 440.

Figure 5:
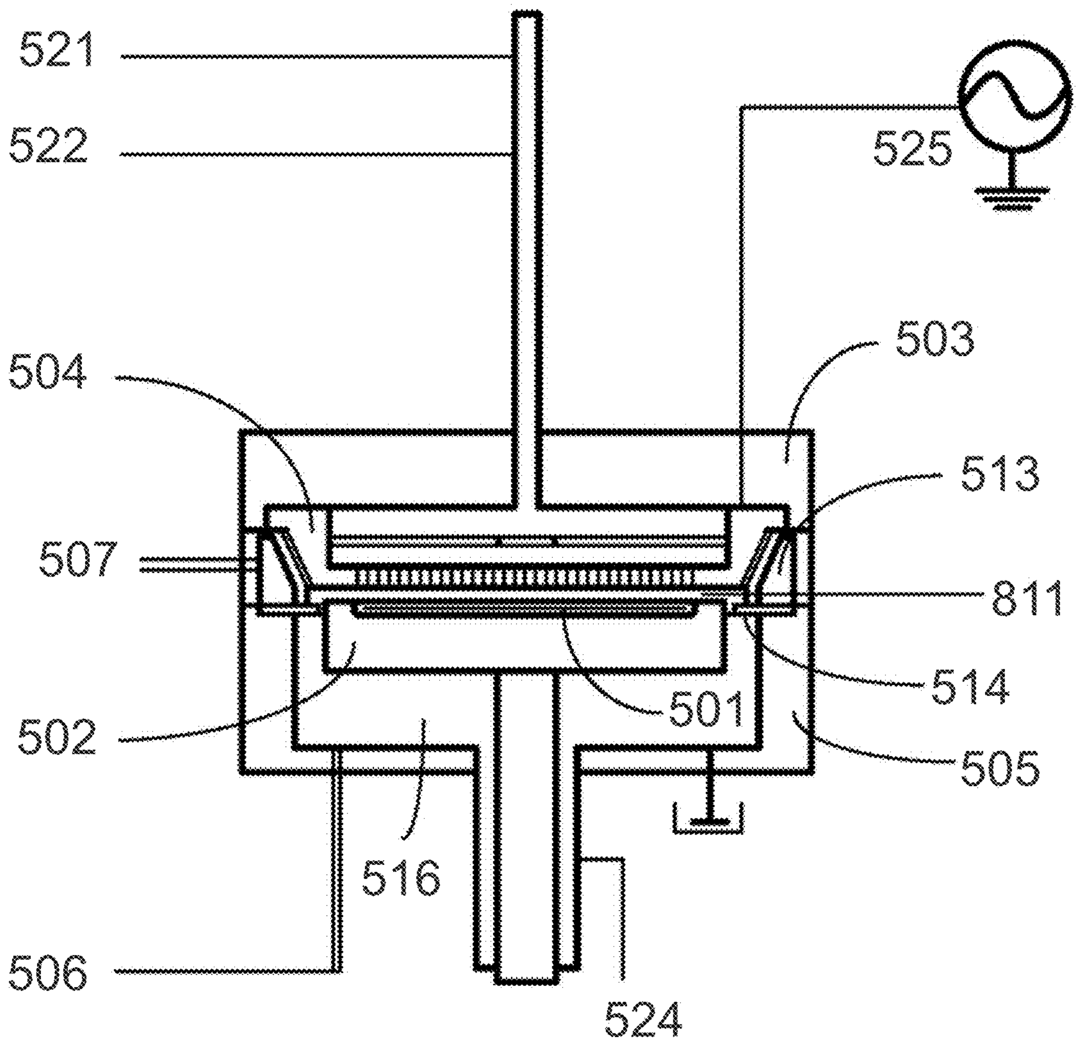

FIG. 5 is a schematic view of an embodiment of a plasma-enhanced atomic layer deposition (PEALD) apparatus.

Figure 6:
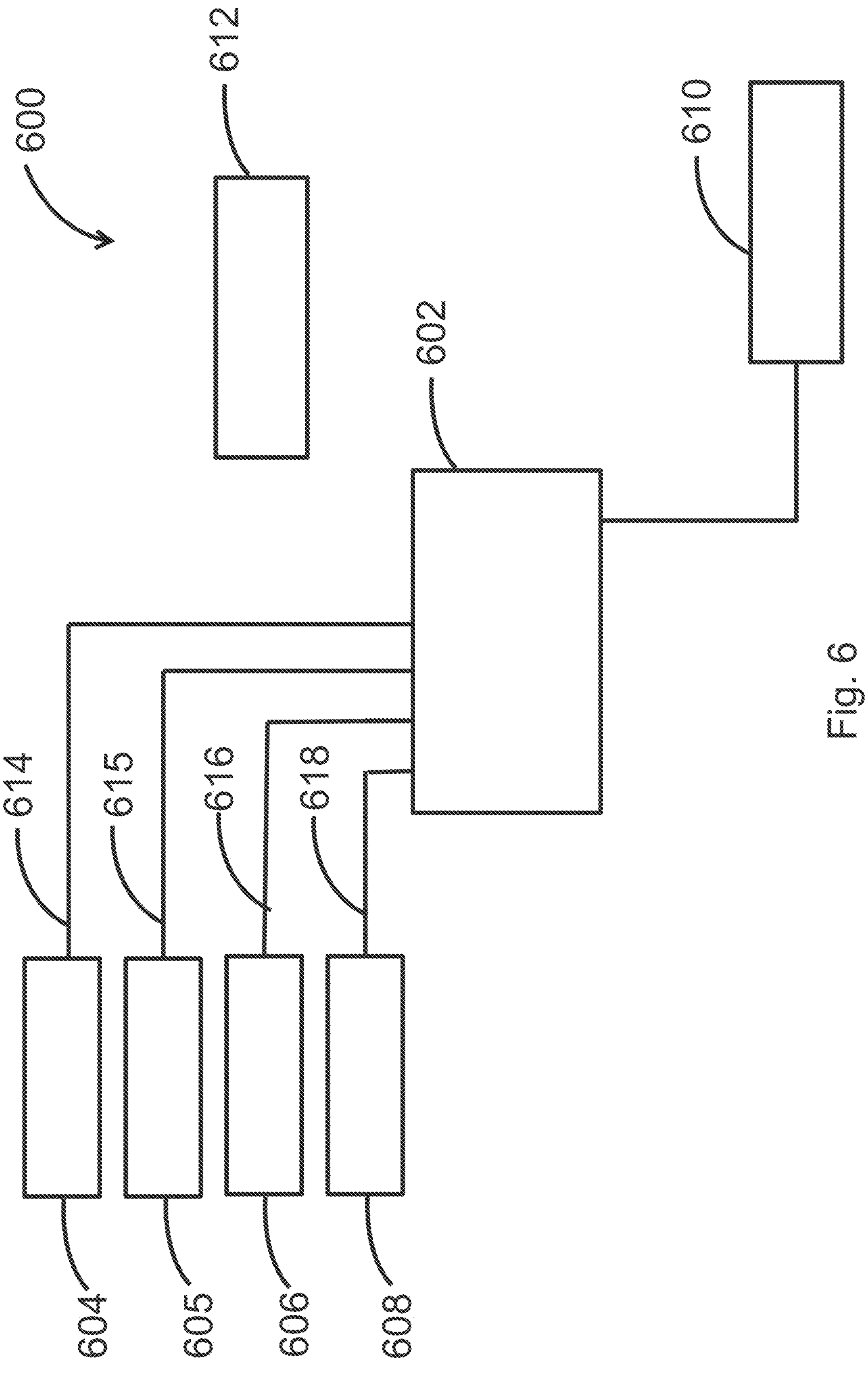

FIG. 6 illustrates a system 600 in accordance with yet additional exemplary embodiments of the disclosure.

Figure 7A:
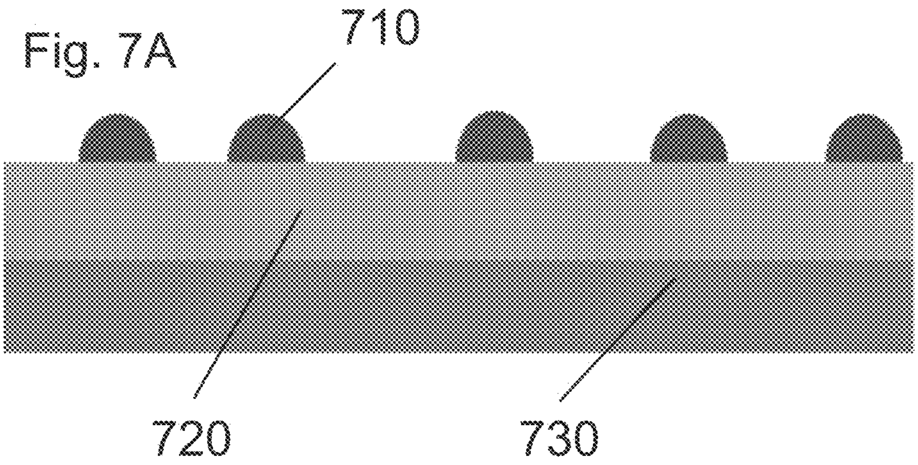
Figure 7B:
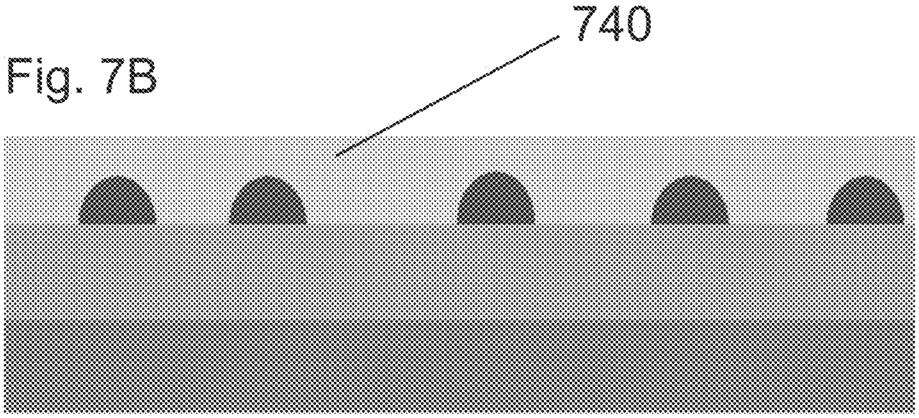
Figure 7C:
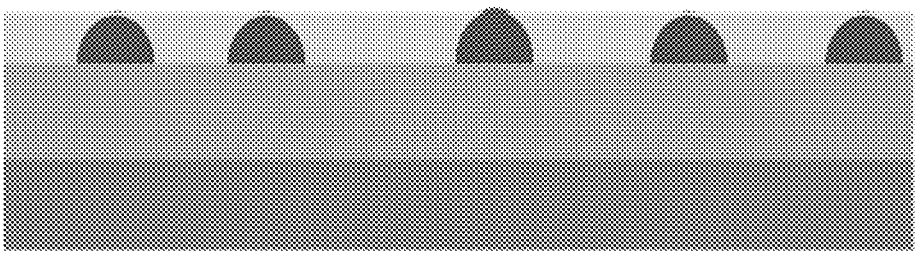

FIGS. 7A-7C show embodiments of structures as described herein.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below As used herein, the term "substrate" may refer to any underlying material or materials, including any underlying material or materials that may be modified, or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

As examples, a substrate in the form of a powder may have applications for pharmaceutical manufacturing. A porous substrate may comprise polymers. Examples of workpieces may include medical devices (for example, stents and syringes), jewelry, tooling devices, components for battery manufacturing (for example, anodes, cathodes, or separators) or components of photovoltaic cells, etc.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

Non-limiting examples of a continuous substrate may include a sheet, a non-woven film, a roll, a foil, a web, a flexible material, a bundle of continuous filaments or fibers (for example, ceramic fibers or polymer fibers). Continuous substrates may also comprise carriers or sheets upon which non-continuous substrates are mounted.

In some embodiments, film refers to a layer extending in a direction perpendicular to a thickness direction. In some embodiments, layer refers to a material having a certain thickness formed on a surface or a synonym of film or a non-film structure. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers. Further, a layer or film can be patterned and can be continuous or discontinuous.

In this disclosure, gas may include material that is a gas at normal temperature and pressure, a vaporized solid and/or a vaporized liquid, and may be constituted by a single gas or a mixture of gases, depending on the context. A gas other than the process gas, i.e., a gas introduced without passing through a gas distribution assembly, such as a showerhead, other gas distribution device, or the like, may be used for, e.g., sealing the reaction space, and may include a seal gas, such as a rare gas.

In some cases, such as in the context of deposition of material, the term precursor can refer to a compound or compounds that participates in the chemical reaction that produces another compound, and particularly to a compound that constitutes a film matrix or a main skeleton of a film, whereas the term reactant can refer to a compound, in some cases other than precursors, that reacts with the precursor, activates the precursor, modifies the precursor, or catalyzes a reaction of the precursor; a reactant may provide an element (e.g., a halide) to a film and become a part of the film. In some cases, the terms precursor and reactant can be used interchangeably. The term inert gas refers to a gas that does not take part in a chemical reaction to an appreciable extent and/or a gas that interacts with a precursor or reactant when, for example, RF or microwave power is applied, but unlike a reactant, it may not become a part of a film matrix to an appreciable extent.

The term cyclic deposition process or cyclical deposition process may refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component. In other cases, the processing techniques may include a plasma process such as plasma enhanced CVD (PECVD) or plasma enhanced ALD (PEALD).

The term atomic layer deposition may refer to a vapor deposition process in which deposition cycles, typically a plurality of consecutive deposition cycles, are conducted in a process chamber. The term atomic layer deposition, as used herein, is meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor(s)/reactive gas(es), and purge (e.g., inert carrier) gas(es).

Generally, for ALD processes, during each cycle, a precursor is introduced to a reaction chamber and is chemisorbed to a deposition surface (e.g., a substrate surface that can include a previously deposited material from a previous ALD cycle or other material), forming about a monolayer or sub-monolayer of material that does not readily react with additional precursor (i.e., a self-limiting reaction). Thereafter, in some cases, a reactant may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, the term purge or purging may refer to a procedure in which gas flow is stopped or a procedure involving continual provision of a carrier gas whereas precursor flow is intermittently stopped. For example, a purge may be provided between a precursor pulse and a reactant pulse, thus avoiding, or at least reducing, gas phase interactions between the precursor and the reactant. It shall be understood that a purge can be affected either in time or in space or both. For example, in the case of temporal purges, a purge step can be used, e.g., in the temporal sequence of providing a precursor to a reactor chamber, providing a purge gas to the reactor chamber, and providing a reactant to the reactor chamber, wherein the substrate on which a layer is deposited does not move. In the case of spatial purges, a purge step can take the form of moving a substrate from a first location to which a precursor is supplied, through a purge gas curtain, to a second location to which a reactant is supplied.

In this disclosure, any two numbers of a variable can constitute a workable range of the variable, and any ranges indicated may include or exclude the endpoints. Additionally, any values of variables indicated (regardless of whether they are indicated with about or not) may refer to precise values or approximate values and include equivalents, and may refer to average, median, representative, majority, etc. in some embodiments. Further, in this disclosure, the terms including, constituted by and having can refer independently to typically or broadly comprising, comprising, consisting essentially of, or consisting of in some embodiments. Further, the term comprising can include consisting of or consisting essentially of. In accordance with aspects of the disclosure, any defined meanings of terms do not necessarily exclude ordinary and customary meanings of the terms.

Described herein are structures, as well as related methods and systems. Structures as described herein can comprise a dose reducing layer, an adhesion layer, and a resist. Advantageously, they can offer good pattern fidelity, few patterning defects, and low EUV dose.

Figure 1A:
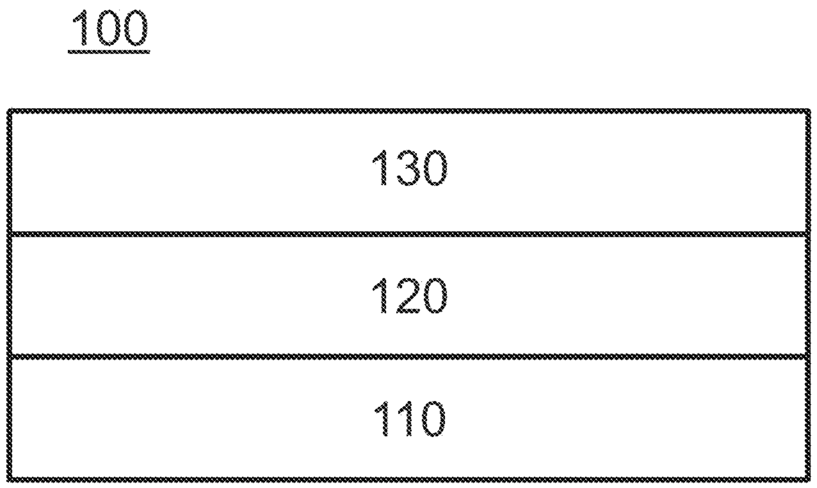

In some embodiments, and with reference to FIG. 1A described herein is an embodiment of a structure 100 that comprises a dose reducing layer 110, an adhesion layer 120, and a resist 130. The dose reducing layer can comprise an extreme ultraviolet (EUV) radiation-absorbing element, e.g. one or more EUV radiation-absorbing elements.

Suitable dose reducing layers 110 can be made employing the methods and systems described in any one of the following references, each of which are incorporated by reference in their entirety: U.S. patent application Ser. Nos. 17/899,928; 17/900,578; and Ser. No. 17/900,065. In some embodiments, the dose reducing layer can comprise metallic tin, i.e. tin in an oxidation state zero. Such dose reducing layers are described in U.S. Provisional Application No. 63/488,648 which is incorporated by reference in its entirety.

In some embodiments, the EUV radiation-absorbing element comprises tin.

Advantageously, the thickness of the dose reducing layer 110 can be very thin, e.g. 7.0 nm or less while still offering proper dose reduction. For example, the dose reducing layer can have a thickness of at least 1.0 nm to at most 7.0 nm, or of at least 0.3 nm to at most 1.0 nm, or of at least 1.0 nm to at most 3.0 nm, or of at least 3.0 nm to at most 5.0 nm, or of at least 5.0 nm to at most 7.0 nm. Advantageously, the thickness of the dose reducing layer 110 can be selected to regulate the dose reduction, with thicker layers generally corresponding to higher dose reduction, all other things being equal.

In some embodiments, the adhesion layer has a thickness of about 10 nm and the dose reducing layer has a thickness of about 2 nm. For example, the adhesion layer can have a thickness of at least 7.0 nm to at most 13.0 nm, and the dose reducing layer can have a thickness of at least 1.0 nm to at most 4.0 nm. Thus, good dose reduction, proper adhesion, and good etch contrast can be obtained.

In some embodiments, the adhesion layer 120 can comprise a cured or an uncured gap filling fluid. Uncured gap filling fluids can comprise a plurality of oligomeric species. Cured gap filling fluids can comprise a resin that can be formed by cross-linking the plurality of uncured oligomeric species. Suitable cured and uncured gap filling fluids can comprise carbon, metal-doped carbon, carbon and hydrogen containing substances, silanes, siloxanes, silazanes, silicon and carbon containing polymers, and borazanes. For example, the cured or uncured gap filling fluid can comprise a silazane as described in U.S. patent application Ser. No. 17/451,280, which is incorporated by reference herein in its entirety. For example, the cured or uncured gap filling fluid can comprise a borazine as described in U.S. patent application Ser. No. 17/467,590 which is incorporated by reference herein in its entirety. For example, the cured or uncured gap filling fluid can comprise a silane as described in U.S. patent application Ser. No. 17/571,835 which is incorporated by reference herein in its entirety. For example, the cured or uncured gap filling fluid can comprise a metal halide, e.g. a metal fluoride, as described in U.S. Patent Application No. 63/250,816 which is incorporated by reference herein in its entirety. For example, the cured and uncured gap filling fluid can comprise one or more copolymers as described in U.S. patent application Ser. No. 18/148,568 which is incorporated by reference herein in its entirety.

With reference to FIGS. 7A, 7B, and 7C, an embodiment of a structure according to the present disclosure is discussed. The structure shown in FIG. 7A comprises a hard mask 730 on which a dose reducing layer 720 is formed. Roughness features 710 are present on the dose reducing layer. In some embodiments, the hard mask comprises amorphous carbon. In some embodiments, the dose reducing layer comprises tin-doped silicon oxycarbide that comprises metallic tin, i.e. tin in an oxidation state zero. As shown in FIG. 7B, a gap filling fluid 740 can be formed on the dose reducing layer 720 to cover the roughness features 710, thereby effectively planarizing the roughness features. In some embodiments, an overburden is formed. This overburden can be etched, e.g. using a plasma, such as a noble gas containing plasma, a hydrogen containing plasma, or an oxygen containing plasma.

The resist 130 can be sensitive to electromagnetic radiation, such as EUV radiation. EUV radiation can refer to electromagnetic radiation with a wavelength between 1 nm and 20 nm, such as about 13.5 nm. In some embodiments, the resist comprises a metalorganic resist. In some embodiments, the resist comprises a metal oxalate. Such resists can be formed using the methods and systems described in any one of the following Patent Applications, all of which are incorporated by reference herein in their entirety: U.S. patent application Ser. No. 17/818,062, U.S. patent application Ser. No. 18/133,728.

The adhesion layer can be positioned between the dose reducing layer and the resist. The adhesion layer can comprise amorphous carbon or an organic compound. Such an adhesion layer can suitably optimize the lithography processing windows against resist collapse, minimize scums, enable pattern transfer from resist, e.g. metalorganic resist, to an underlying layer with good selectivity.

Figure 1B:
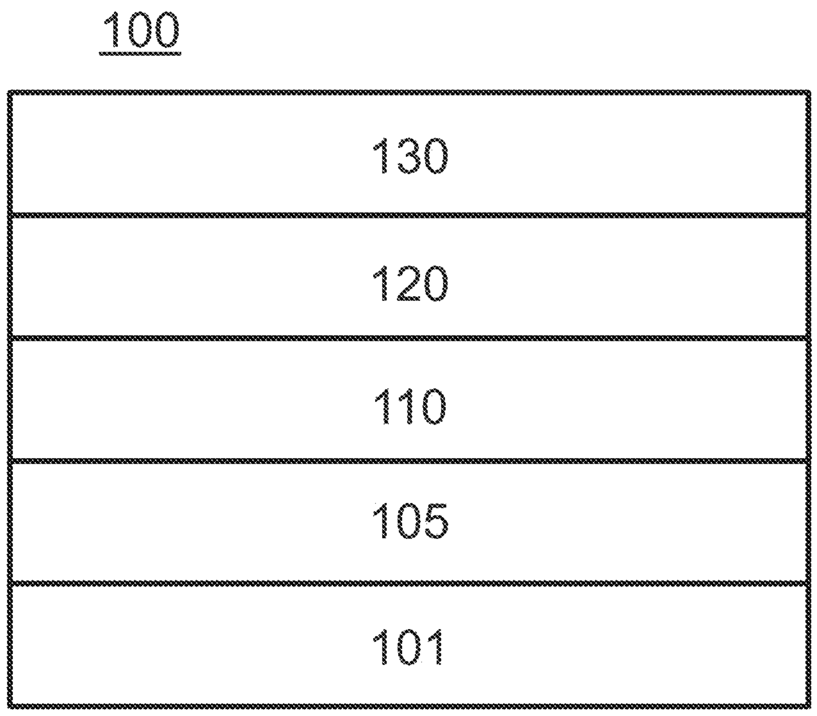

In some embodiments, and with reference to FIG. 1B, an embodiment of a structure as described herein can further comprise a hard mask 105. The hard mask can be positioned between a substrate 101 and the dose reducing layer 110. Suitable hard masks include amorphous carbon, metals, metal oxides, metal nitrides, metal carbides, and the like. When the hard mask contains a metal, that metal can be selected from a transition metal, a post transition metal, and a rare earth metal.

The hard mask can comprise any suitable material such as amorphous carbon, metal-doped amorphous carbon, silicon oxide, silicon oxycarbide, silicon nitride, silicon oxynitride, silicon oxycarbonitride, or an oxide, nitride, carbide, oxynitride, oxycarbide, carbonitride, or oxycarbonitride comprising one or more of a transition metal, a post transition metal, and a rare earth metal. Advantageously, the hard mask can exhibit etch contrast vis-à-vis the resist. In other words, the hard mask and the resist can exhibit different etch rates vis-à-vis one or more etchants.

In some embodiments, the hard mask can be exposed to a surface treatment, e.g. a plasma treatment, to improve adhesion between the hard mask and the dose reducing layer. Suitable surface treatments for amorphous carbon hard masks are described in U.S. patent application Ser. No. 17/568,027 which is incorporated by reference herein in its entirety.

Figure 1C:
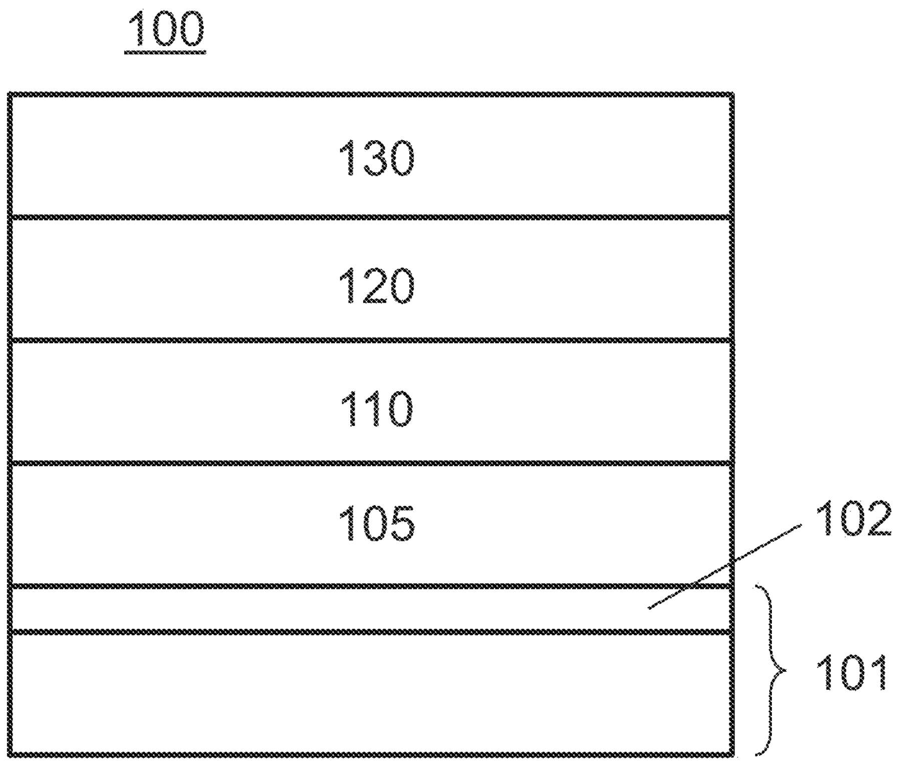

Structures 100 and methods as disclosed herein can be employed for patterning substrates 101 or parts thereof. In some embodiments, and with reference to FIG. 1C, a substrate 101 can comprise a patternable film 102. In some embodiments, the hard mask 105 can be positioned between the patternable film and the dose reducing layer 110.

Figure 2:
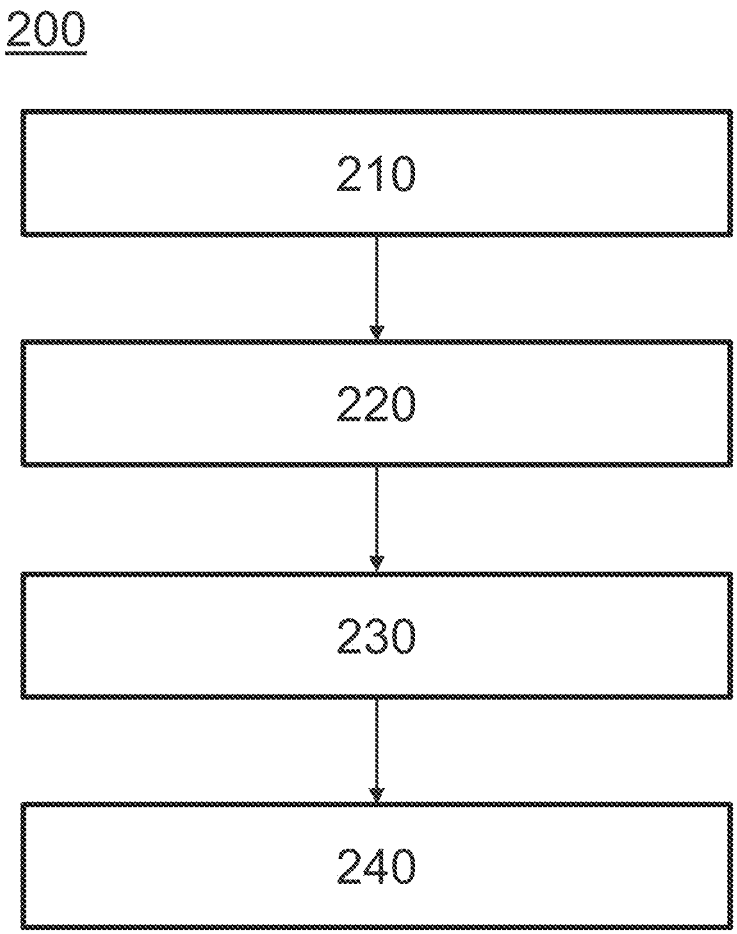
FIG. 2 shows an embodiment of a method 200 of forming a structure.

With reference to FIG. 2, further described herein is a method 200 of forming a structure, e.g. a structure 100 as described herein. The method can comprise a step 210 of providing a substrate to a reaction chamber. In some embodiments, the substrate comprises a hard mask on which the dose reducing layer can be formed. Then, the method can comprise a step 220 of forming a dose reducing layer on the substrate. The dose reducing layer can comprise an EUV-absorbing element. Then, the method can comprise a step 230 of forming an adhesion layer, e.g. on the dose reducing layer. The adhesion layer can comprise amorphous carbon or an organic compound. Then, the method can comprise a step 240 of forming a resist, e.g. on the adhesion layer.

It shall be understood that while the aforementioned steps can be advantageously executed in the given order, a method according to an embodiment of the present disclosure can further comprise intermediary steps to form intermediary layers, e.g. glue layers, e.g. doped or undoped silicon oxycarbide layers, between the steps given.

In some embodiments, the dose reducing layer is formed by means of plasma-enhanced atomic layer deposition.

In some embodiments, the hard mask is formed by means of plasma-enhanced chemical vapor deposition.

In some embodiments, the resist is formed by means of molecular layer deposition.

Figure 3A:
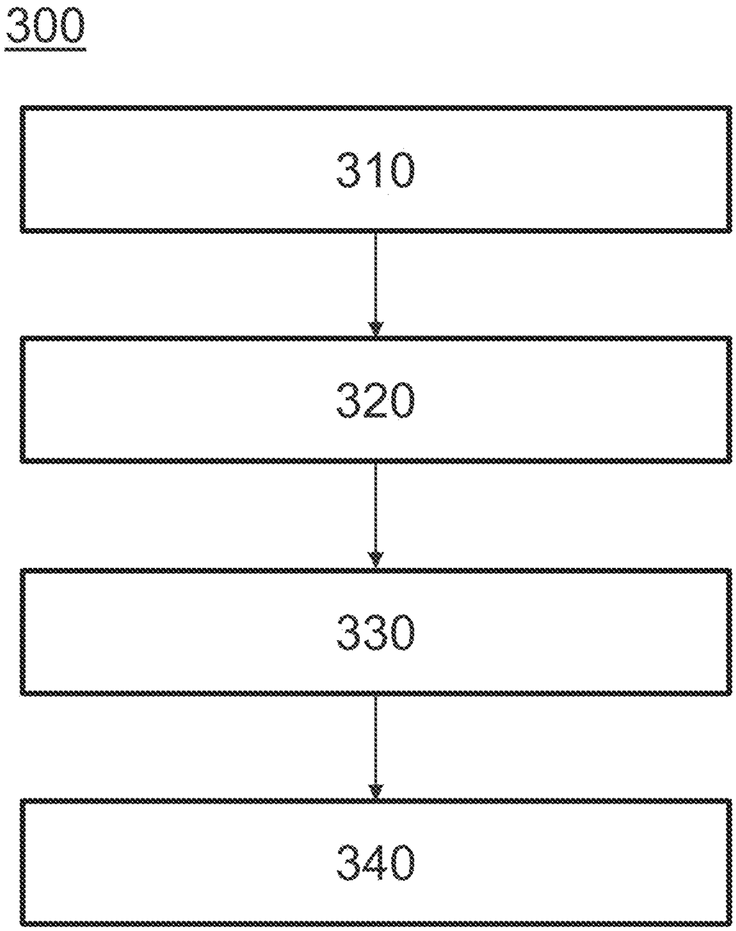
FIGS. 3A-3B show an embodiment of a method 300 of transferring a pattern to a substrate.
Figure 3B:
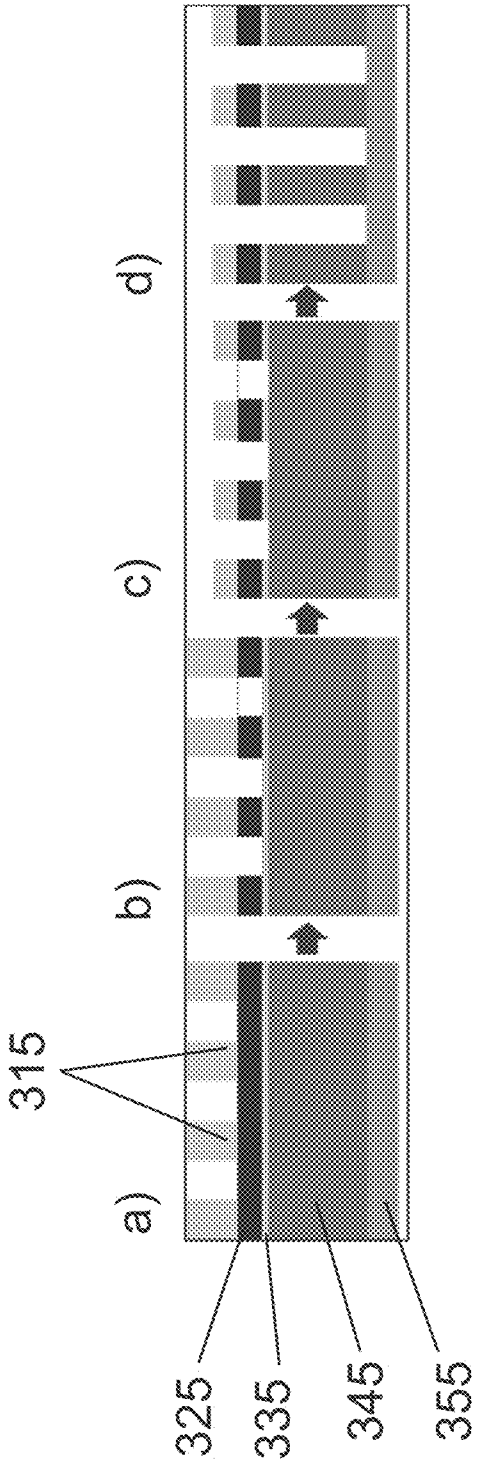

With reference to FIGS. 3A and 3B, further described herein is a method 300 of transferring a pattern to a substrate. The method can comprise a step 310 of providing a substrate. The substrate can comprise a structure, e.g. a structure as described herein. The structure can comprise a dose reducing layer 335 that comprises an extreme ultraviolet (EUV) radiation-absorbing element, a patterned resist 315 that comprises a pattern, and an adhesion layer 325 that is positioned between the dose reducing layer and the resist. The adhesion layer 325 can comprise amorphous carbon or an organic compound. The structure can further comprise a hard mask 345. The dose reducing layer 335 can be positioned between the hard mask 345 and the adhesion layer 325. The hard mask 345 can be formed on a patternable layer 355, i.e. on a layer that is to be patterned. Such a structure is shown in FIG. 3B, structure a).

The method 300 can further comprise a step 320 of exposing the substrate to a first etch to transfer the pattern from the resist to the adhesion layer, which can result in the situation shown in FIG. 3B, structure b).

The method 300 can further comprise a step 330 of exposing the substrate to a second etch to transfer the pattern from the adhesion layer to the dose reducing layer, which can result in the situation shown in FIG. 3B, structure c).

The method 300 can further comprise a step 340 of exposing the substrate to a third etch, thereby transferring the pattern from the dose reducing layer to the hard mask, which can result in the situation shown in FIG. 3B, structure d).

In some embodiments, the first etch, the second etch, and the third etch are different. In some embodiments, at least two etches selected from the first etch, the second etch, and the third etch, are different.

Resists and dose reducing layers can comprise one or more EUV radiation-absorbing elements. Suitable EUV radiation absorbing elements can include one or more elements selected from tin (Sn), manganese (Mn), iron (Fe), cobalt (Co), nickel (Ni), copper (Cu), zinc (Zn), gallium (Ga), germanium (Ge), arsenic (As), indium (In), tellurium (Te), cesium (Cs), antimony (Sb), bismuth (Bi), silver (Ag), lead (Pb), gold (Au), platinum (Pt), iridium (Ir), magnesium (Mg), sodium (Na), and aluminum (Al).

Further described herein are systems that comprise comprising one or more precursor sources, a reaction chamber operationally coupled with the one or more precursor sources, and a controller. The controller can be arranged for causing the system to carry out at least a part of a method as described herein.

With reference to FIG. 4, described herein is a system 400 that comprises a dose reducing layer reaction chamber 410, a resist reaction chamber 420, an adhesion layer reaction chamber 430, and a transfer module 440.

The dose reducing layer reaction chamber 410 is constructed and arranged for forming a dose reducing layer.

The resist reaction chamber 420 is constructed and arranged for forming a resist.

The adhesion layer reaction chamber 430 is constructed and arranged for forming an adhesion layer.

The transfer module 440 is constructed and arranged for moving a substrate between the dose reducing layer reaction chamber 410, the resist reaction chamber 420, and the adhesion layer reaction chamber 430 while keeping the substrate in a vacuum or inert gas environment.

Each of the dose reducing layer reaction chamber 410, the resist reaction chamber 420, and the adhesion layer reaction chamber 430 can be operationally coupled with one or more precursor sources. For example, the dose reducing layer reaction chamber 410 can be operationally coupled with one or more dose reducing layer precursor sources 411,412. For example, the resist reaction chamber 420 can be operationally coupled with one or more resist precursor sources 421. For example, the adhesion layer reaction chamber 430 can be operationally coupled with one or more adhesion layer precursor sources 431,432,433.

The system 400 further comprises a controller 450. The controller 450 is arranged for causing the system 400 to carry out a method as described herein.

Layers and structures, or parts thereof, formed in embodiments of methods according to the present disclosure may be formed in any suitable apparatus, including in a reactor as shown in FIG. 5. FIG. 5 is a schematic view of an embodiment of a plasma-enhanced atomic layer deposition (PEALD) apparatus, desirably in conjunction with controls programmed to conduct the sequences described below, usable in some embodiments of the present disclosure. In this figure, by providing a pair of electrically conductive flat-plate electrodes (502,504) in parallel and facing each other in the interior (511) (reaction zone) of a reaction chamber (503), applying RF power (e.g. at 13.56 MHz and/or 27 MHz) from a power source (525) to one side, and electrically grounding the other side (512), a plasma is excited between the electrodes. A temperature regulator may be provided in a lower stage (502), i.e. the lower electrode. A substrate (501) is placed thereon and its temperature is kept constant at a given temperature. The upper electrode (504) can serve as a shower plate as well, and a reactant gas and/or a dilution gas, if any, as well as a precursor gas can be introduced into the reaction chamber (503) through a gas line (521) and a gas line (522), respectively, and through the shower plate (504).

Additionally, in the reaction chamber (503), a circular duct (513) with an exhaust line (517) is provided, through which the gas in the interior (511) of the reaction chamber (503) is exhausted. Additionally, a transfer chamber (505) is disposed below the reaction chamber (503) and is provided with a gas seal line (524) to introduce seal gas into the interior (511) of the reaction chamber (503) via the interior (516) of the transfer chamber (505) wherein a separation plate (514) for separating the reaction zone and the transfer zone is provided.

Note that a gate valve through which a wafer may be transferred into or from the transfer chamber (505) is omitted from this figure. The transfer chamber is also provided with an exhaust line (506). In some embodiments, forming the dose reducing layer, forming the adhesion layer, and forming the resist is done in the same reaction chamber. In some embodiments, one or more of these layers are formed in separate reaction chambers comprised in one cluster system in which substrates are transferable from one reaction chamber to another without breaking vacuum or while maintaining the substrates in an inert gas ambient.

FIG. 6 illustrates a system 600 in accordance with yet additional exemplary embodiments of the disclosure. System 600 can be used to perform a method as described herein and/or form a structure or device portion as described herein, such as a hard mask, dose reducing layer, adhesion layer, and/or resist.

In the illustrated example, system 600 includes one or more reaction chambers 602, a precursor gas source 604, a gas source 605, a reactant gas source 606, a purge gas source 608, an exhaust 610, and a controller 612.

Reaction chamber 602 can include any suitable reaction chamber, such as an ALD or CVD reaction chamber.

Precursor gas source 604 can include a vessel and one or more precursors-alone or mixed with one or more carrier (e.g., inert) gases. Reactant gas source 606 can include a vessel and one or more reactants as described herein-alone or mixed with one or more carrier gases. Purge gas source 608 can include one or more inert gases as described herein. Although illustrated with four gas sources 604-608, system 600 can include any suitable number of gas sources. Gas sources 604-608 can be coupled to reaction chamber 602 via lines 614-618, which can each include flow controllers, valves, heaters, and the like.

Exhaust 610 can include one or more vacuum pumps.

Controller 612 includes electronic circuitry and software to selectively operate valves, manifolds, heaters, pumps and other components included in the system 600. Such circuitry and components operate to introduce precursors, reactants, and purge gases from the respective sources 604-608. Controller 612 can control timing of gas pulse sequences, temperature of the substrate and/or reaction chamber, pressure within the reaction chamber, and various other operations to provide proper operation of the system 600. Controller 612 can include control software to electrically or pneumatically control valves to control flow of precursors, reactants and purge gases into and out of the reaction chamber 602. Controller 612 can include modules such as a software or hardware component, e.g., a FPGA or ASIC, which performs certain tasks. A module can advantageously be configured to reside on the addressable storage medium of the control system and be configured to execute one or more processes.

Other configurations of system 600 are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into the reaction chamber 602. Further, as a schematic representation of a system, many components have been omitted for simplicity of illustration, and such components may include, for example, various valves, manifolds, purifiers, heaters, containers, vents, and/or bypasses.

During operation of reactor system 600, substrates, such as semiconductor wafers (not illustrated), are transferred from, e.g., a substrate handling system to reaction chamber 602. Once substrate(s) are transferred to reaction chamber 602, one or more gases from gas sources 604-608, such as precursors, reactants, carrier gases, and/or purge gases, are introduced into reaction chamber 602.

The illustrations presented herein are not meant to be actual views of any particular material, structure, or device, but are merely idealized representations that are used to describe embodiments of the disclosure.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and sub-combinations of the various processes, systems, and configurations, and other features, functions, acts, and/or properties disclosed herein, as well as any and all equivalents thereof.

The invention claimed is:

1. A structure comprising a dose reducing layer, the dose reducing layer comprising an extreme ultraviolet (EUV) radiation-absorbing element;

a resist, the resist being sensitive to EUV radiation; and an adhesion layer, the adhesion layer being positioned between the dose reducing layer and the resist, the adhesion layer comprising amorphous carbon or an organic compound; and a hard mask, wherein the dose reducing layer is positioned between the hard mask and the adhesion layer.

2. The structure according to claim 1 further comprising a patternable film, the hard mask being positioned between the patternable film and the dose reducing layer.

3. The structure according to claim 1, wherein the dose reducing layer has a thickness of at most 7.0 nm.

4. The structure according to claim 1, wherein the resist comprises a metalorganic resist.

5. The structure according to claim 1, wherein the EUV radiation-absorbing element comprises tin.

6. A method of forming a structure, comprising the following steps, in the given order:

providing a substrate comprising a hard mask to a reaction chamber;

forming a dose reducing layer on the substrate, the dose reducing layer comprising an extreme ultraviolet (EUV) radiation-absorbing element;

forming an adhesion layer on the dose reducing layer, the adhesion layer comprising amorphous carbon or an organic compound; and, forming a resist on the adhesion layer, the resist being sensitive to EUV radiation, wherein the dose reducing layer is positioned between the hard mask and the adhesion layer.

7. The method according to claim 6, wherein the structure formed comprises the dose reducing layer, the resist, and the adhesion layer; and the adhesion layer is positioned between the dose reducing layer and the resist.

8. The method according to claim 6, wherein the dose reducing layer is formed by plasma-enhanced atomic layer deposition.

9. The method according to claim 6, further comprising forming the hard mask by plasma-enhanced chemical vapor deposition.

10. The method according to claim 6, wherein the resist is formed by molecular layer deposition.

11. A system comprising a dose reducing layer reaction chamber being constructed and arranged for forming a dose reducing layer;

a resist reaction chamber being constructed and arranged for forming a resist;

an adhesion layer reaction chamber being constructed and arranged for forming an adhesion layer;

a transfer module constructed and arranged for moving a substrate between the dose reducing layer reaction chamber, the resist reaction chamber, and the adhesion layer reaction chamber while keeping the substrate in a vacuum or inert gas environment; and a controller, wherein each of the dose reducing layer reaction chamber, the resist reaction chamber, and the adhesion layer reaction chamber are operationally coupled with one or more precursor sources, and wherein the controller is arranged for causing the system to carry out a method according to claim 6.

12. A method of transferring a pattern onto a substrate, the method comprising providing the substrate, the substrate comprising a structure, the structure comprising:

a dose reducing layer comprising an extreme ultraviolet (EUV) radiation-absorbing element, a patterned resist, the patterned resist being sensitive to EUV radiation and comprising the pattern, an adhesion layer comprising amorphous carbon or an organic compound, and a hard mask, wherein the adhesion layer is positioned between the dose reducing layer and the patterned resist, and wherein the dose reducing layer is positioned between the hard mask and the adhesion layer;

exposing the substrate to a first etch, thereby transferring the pattern from the patterned resist to the adhesion layer;

exposing the substrate to a second etch, thereby transferring the pattern from the adhesion layer to the dose reducing layer; and exposing the substrate to a third etch, thereby transferring the pattern from the dose reducing layer to the hard mask, wherein the first etch, the second etch, and the third etch are different.

* * * * *